(12) United States Patent
Caplet et al.

(10) Patent No.: US 10,923,460 B2
(45) Date of Patent: Feb. 16, 2021

(54) DEVICE AND METHODS FOR THE TRANSFER OF CHIPS FROM A SOURCE SUBSTRATE ONTO A DESTINATION SUBSTRATE

(71) Applicant: Commissariat à l'Énergie Atomique et aux Énergies Alternatives, Paris (FR)

(72) Inventors: Stéphane Caplet, Grenoble (FR); Laurent Mollard, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 16 days.

(21) Appl. No.: 16/450,557

(22) Filed: Jun. 24, 2019

(65) Prior Publication Data

US 2019/0393201 A1  Dec. 26, 2019

(30) Foreign Application Priority Data

Jun. 25, 2018 (FR) ...................................... 1855672

(51) Int. Cl.
| | |
|---|---|
| *B81C 99/00* | (2010.01) |
| *H01L 25/13* | (2006.01) |
| *H01L 21/67* | (2006.01) |
| *H01L 33/50* | (2010.01) |
| *H01L 33/62* | (2010.01) |
| *H01L 21/762* | (2006.01) |

(52) U.S. Cl.
CPC ............ *H01L 25/13* (2013.01); *B81C 99/008* (2013.01); *H01L 21/67121* (2013.01); *H01L 21/76256* (2013.01); *H01L 33/50* (2013.01); *H01L 33/62* (2013.01); *H01L 2933/0033* (2013.01)

(58) Field of Classification Search
None
See application file for complete search history.

(56) References Cited

U.S. PATENT DOCUMENTS

| | | | |
|---|---|---|---|
| 7,838,322 B1 * | 11/2010 | Vargo | .................... B81C 99/008 438/53 |
| 9,368,683 B1 * | 6/2016 | Meitl | ...................... H01L 33/26 |
| 10,002,928 B1 | 6/2018 | Raring et al. | |

(Continued)

FOREIGN PATENT DOCUMENTS

FR  3 044 467 A1  6/2017

OTHER PUBLICATIONS

Preliminary Search Report for French Application No. 1855672, dated Jan. 22, 2019.

*Primary Examiner* — Evren Seven
(74) *Attorney, Agent, or Firm* — Wolf, Greenfield & Sacks, P.C.

(57) ABSTRACT

A device for the transfer of chips from a source substrate onto a destination substrate, including: a source substrate having a lower surface and an upper surface; and a plurality of elementary chips arranged on the upper surface of the source substrate, wherein each elementary chip is suspended above the source substrate by at least one breakable mechanical fastener, said at least one breakable mechanical fastener having a lower surface fastened to the upper surface of the source substrate and an upper surface fastened to the lower surface of the chip.

7 Claims, 5 Drawing Sheets

(56) References Cited

U.S. PATENT DOCUMENTS

| | | | |
|---|---|---|---|
| 2003/0157783 A1* | 8/2003 | Fonash | B81C 99/008 438/458 |
| 2004/0222500 A1* | 11/2004 | Aspar | B81C 99/008 257/629 |
| 2005/0095742 A1* | 5/2005 | Silverbrook | H01L 21/6835 438/50 |
| 2006/0134893 A1* | 6/2006 | Savage | H01L 21/6835 438/483 |
| 2012/0228669 A1* | 9/2012 | Bower | H01L 27/3255 257/103 |
| 2012/0314388 A1* | 12/2012 | Bower | H01L 24/83 361/760 |
| 2013/0115754 A1* | 5/2013 | Chen | B81C 1/0015 438/459 |
| 2013/0196474 A1* | 8/2013 | Meitl | H01L 31/184 438/127 |
| 2013/0221355 A1* | 8/2013 | Bower | H01L 33/16 257/48 |
| 2013/0309792 A1 | 11/2013 | Tischler et al. | |
| 2015/0371874 A1* | 12/2015 | Bower | H01L 24/83 438/112 |
| 2016/0086855 A1* | 3/2016 | Bower | H01L 21/7806 438/110 |
| 2017/0207193 A1* | 7/2017 | Bower | B41F 16/0046 |
| 2018/0022603 A1* | 1/2018 | Chu | B81C 1/00825 257/416 |
| 2018/0151804 A1 | 5/2018 | Chaji et al. | |
| 2018/0265353 A1* | 9/2018 | Chen | B41J 2/1637 |

\* cited by examiner

DEVICE AND METHODS FOR THE TRANSFER OF CHIPS FROM A SOURCE SUBSTRATE ONTO A DESTINATION SUBSTRATE This application claims the priority benefit of French patent application number 18/55672, the content of which is hereby incorporated by reference in its entirety to the maximum extent allowable by law.

BACKGROUND

The present disclosure concerns techniques of chip transfer from a source substrate onto a destination substrate, for the manufacturing of electronic or optoelectronic devices, and in particular for the manufacturing of an image display device comprising a plurality of elementary electronic chips assembled on a same transfer substrate. The present disclosure more particularly aims at a device for the transfer of chips from a source substrate onto a destination substrate, a method of manufacturing such a device, and a method of chip transfer from a source substrate onto a destination substrate by means of such a device.

DISCUSSION OF THE RELATED ART

A method of manufacturing an image display device comprising a plurality of elementary electronic chips arranged in an array on a same transfer substrate has already been provided, in French patent application Nr. 1561421 filed on Nov. 26, 2015. According to this method, the chips and the transfer substrate are manufactured separately. Each elementary chip comprises a stack of a light-emitting diode (LED) and of a LED control circuit. The control circuit comprises a connection surface opposite to the LED, comprising a plurality of electric connection areas intended to be connected to the transfer substrate for the chip control. The transfer substrate comprises a connection surface comprising, for each chip, a plurality of electric connection areas intended to be respectively connected to the electric connection areas of the chip. The chips are then transferred onto the transfer substrate, with their connection surfaces facing the connection surface of the transfer substrate, and fastened to the transfer substrate to connect the electric connection areas of each chip to the corresponding electric connection areas of the transfer substrate.

On implementation of the transfer step, the individualized elementary chips are arranged on a support substrate, or source substrate, each chip being fastened to the source substrate by its surface opposite to its electric connection surface. The chips are then positioned opposite the corresponding connection areas of the transfer substrate, or destination substrate, the connection surfaces of the chips facing the connection surface of the destination substrate, using the source substrate as a handle. The chips are then fastened to the destination substrate to place the electric connection areas of each chip in contact with the corresponding connection areas of the destination substrate. The chips are then separated from the source substrate, and the latter is removed.

In practice, the pitch of the elementary chips on the source substrate may be smaller than the pitch of the final device, that is, than the pitch of the chips on the destination substrate. In this case, it is provided, at each transfer step, to transfer only part of the chips from the source substrate onto the destination substrate, with the pitch of the source substrate and then, if need be, to shift the source substrate with the remaining chips to transfer another part of the chips, and so on until all the chips of the display device have been fastened to the destination substrate.

A difficulty which arises in such a method is that the bonding energy between the elementary chips and the source substrate should be accurately controlled. In particular, the bonding energy between the elementary chips and the source substrate should be sufficiently high to maintain the chips in place during the positioning of the chips opposite the corresponding reception areas of the destination substrate, but sufficiently low for, once bonded to the destination substrate, the chips to separate from the source substrate upon removal thereof.

The accurate and reproducible control of the bonding energy between the elementary chips and the source substrate is difficult to achieve, which raises practical problems on manufacturing of the display device. Such a difficulty is further enhanced when it is desired to selectively separate the chips from the source substrate to change the pitch between the source substrate and the destination substrate as described hereabove.

More generally, this problem may arise in other fields of application requiring transferring elementary chips from a source substrate onto a destination substrate.

International patent application WO2015/193435 describes a device and a method for transferring micro-devices such as electronic chips from a source substrate onto a destination substrate. In this document, the micro-devices are connected to the source substrate by breakable mechanical fasteners provided to break when predetermined mechanical stress is applied thereto. The micro-devices are first collected from the source substrate by means of an intermediate transfer substrate of elastomer film type (causing the breakage of the breakable fasteners), and then transferred onto the destination substrate by means of the intermediate transfer substrate. The solution provided in this document however has various disadvantages. In particular, a disadvantage is that the breakable mechanical fasteners connecting the micro-devices to the source substrate occupy a relatively large surface area on the source substrate, which limits the surface density of micro-devices capable of being provided on the source substrate. Further, this document does not describe the forming of electric connections between the micro-devices and the source substrate. Another disadvantage is due to the use of an intermediate transfer substrate, which makes the implementation of the transfer operation relatively complex (with, in particular, the risk of degrading the layers in contact with the transfer tool).

It would be desirable to have a solution enabling to transfer chips from a source substrate onto a destination substrate, such a solution at least partially overcoming one or a plurality of the disadvantages of known solutions.

It would in particular be desirable to have a transfer solution adapted to the manufacturing of a display device of the type described in above-mentioned French patent application Nr. 1561421.

SUMMARY

Thus, an embodiment provides a device for the transfer of chips from a source substrate onto a destination substrate, comprising:
a source substrate having a lower surface and an upper surface; and
a plurality of elementary chips arranged on the upper surface of the source substrate, wherein each elementary chip is suspended above the source substrate by at least one breakable mechanical fastener, said at least one breakable mechanical fastener having a lower surface fastened to the upper surface of the source substrate and an upper surface fastened to the lower surface of the chip.

According to an embodiment, for each chip, said at least one breakable mechanical fastener connecting the chip to the source substrate is entirely located under the chip.

According to an embodiment, for each chip, said at least one breakable mechanical fastener connecting the chip to the source substrate is only partly located under the chip.

According to an embodiment, for each elementary chip, a portion only of the lower surface of the chip is in contact with said at least one breakable mechanical fastener, the remaining portion of the lower surface of the chip being separated from the upper surface of the source substrate by a region free of any solid material.

According to an embodiment, each elementary chip comprises one or a plurality of terminals of electric connection to an external device arranged on the side of its surface opposite to the source substrate.

According to an embodiment, each elementary chip further comprises one or a plurality of terminals of electric connection to an external device arranged on the side of its surface facing the source substrate.

According to an embodiment, the upper surface of the source substrate has a surface roughness greater than 5 nm.

According to an embodiment, each elementary chip comprises a LED.

According to an embodiment, each elementary chip comprises a stack of a LED and of an elementary LED control circuit, the elementary control circuit being arranged on the side of the LED opposite to the source substrate.

According to an embodiment, each elementary chip is a wavelength conversion element.

Another embodiment also provides a method of manufacturing a device such as defined hereabove, comprising the successive steps of:

a) forming on the upper surface of the source substrate a first stack comprising an alternation of at least one permanent solid layer and of at least one sacrificial layer to define the breakable mechanical fasteners of the device;

b) placing on the upper surface of the first stack a functional layer;

c) forming singulation trenches crossing the functional layer and delimiting the elementary chips of the device; and d) etching said at least one sacrificial layer of the connection stack without removing said at least one permanent solid layer.

Another embodiment also provides a method of manufacturing a device such as defined hereabove, comprising the successive steps of:

a) forming a functional layer on a surface of a temporary support substrate;

b) forming, on the surface of the functional layer opposite to the temporary support substrate, a connection stack comprising an alternation of at least one permanent solid layer and of at least one sacrificial layer to define the breakable mechanical fasteners of the device;

c) placing the assembly comprising the temporary support substrate, the functional layer, and the connection stack on the upper surface of the source substrate, so that the temporary support substrate is arranged on the side of the connection stack opposite to the source substrate, and then removing the temporary support substrate;

d) forming singulation trenches crossing the functional layer and delimiting the elementary chips of the device; and e) etching said at least one sacrificial layer of the connection stack without removing said at least one permanent solid layer.

According to an embodiment, said at least one permanent solid layer is made of silicon oxide, and said at least one sacrificial layer is made of polysilicon.

According to an embodiment, the step of etching said at least one sacrificial layer of the connection stack without removing said at least one permanent solid layer is carried out by etching based on xenon difluoride.

Another embodiment provides a method of transferring elementary chips from a source substrate onto a destination substrate by means of a device such as defined hereabove, comprising the successive steps of:

positioning the elementary chips opposite corresponding transfer areas of the destination substrate, using the source substrate as a handle;

fastening the elementary chips to the destination substrate by their surface opposite to the source substrate; and removing the source substrate from the destination substrate to break the breakable mechanical fasteners connecting to the source substrate the elementary chips which are now fastened to the destination substrate.

According to an embodiment, the step of fastening the elementary chips to the destination substrate comprises the electric connection of electric connection terminals previously formed on the surface of the elementary chips opposite to the source substrate, to corresponding electric connection terminals of the destination substrate.

According to an embodiment, the pitch of the elementary chips of the source substrate is smaller than the pitch of the elementary chips on the destination substrate.

The foregoing and other features and advantages will be discussed in detail in the following non-limiting description of specific embodiments in connection with the accompanying drawings.

DETAILED DESCRIPTION

Figure 1A:
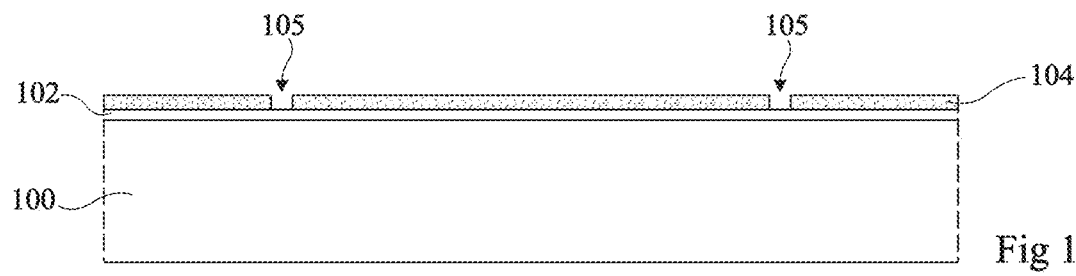
FIGS. 1A, 1B, 1C, 1D, 1E, 1F, and 1G are cross-section views illustrating steps of an embodiment of a method of manufacturing a device for the transfer of chips from a source substrate onto a destination substrate.

The same elements have been designated with the same reference numerals in the various drawings and, further, the various drawings are not to scale. For clarity, only those steps and elements which are useful to the understanding of the described embodiments have been shown and are detailed. In particular, the structures and the functionalities of the elementary chips which are desired to be transferred from a source substrate onto a destination substrate have not been detailed, the described embodiments being compatible with all or part of known chip structures and functionalities. Further, the structures and the functions of the electronic or optoelectronic devices which are desired to be formed have not been detailed, the described embodiments being compatible with the forming of any device requiring for its manufacturing a transfer of one or a plurality of chips from a source substrate onto a destination substrate.

It should be noted that chip here means a thin-film microstructure, for example, a structure having all its horizontal dimensions (that is, its dimensions in top view) smaller than 5 mm, for example, smaller than 1 mm, for example, smaller than 0.5 mm, for example, smaller than 0.1 mm, for example, smaller than 50 μm, and having a thickness smaller than 1 mm, for example, smaller than 0.5 mm, for example, smaller than 0.1 mm, for example, smaller than 50 μm. In the sense of the present disclosure, a chip may comprise one or a plurality of active and/or passive electronic components, and/or one or a plurality of optoelectronic components, and/or one or a plurality of optical components.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings, it being understood that, in practice, the described structures may be oriented differently. The terms "approximately", "substantially", and "in the order of" are used herein to designate a tolerance of plus or minus 10%, preferably of plus or minus 5%, of the value in question.

It is here provided to form an assembly comprising a source substrate having a lower surface and an upper surface, and a plurality of elementary chips arranged on the upper surface of the source substrate, each chip being maintained suspended above the source substrate by at least one breakable mechanical fastener or connector. According to an aspect of an embodiment, each breakable mechanical fastener has a lower surface fastened to the lower surface of the source substrate and an upper surface fastened to the lower surface of the corresponding chip. Thus, each breakable mechanical fastener is at least partly located under (vertically in line with) the corresponding chip. This is a difference with the solutions described in above-mentioned international patent application WO2015/193435, where the breakable mechanical fasteners are located next to the chips and fastened to the lateral surfaces of the chips, which limits the chip surface density (number of chips per surface area unit) capable of being provided on the upper surface of the source substrate. In a particularly advantageous embodiment, each breakable mechanical fastener is entirely located under the corresponding chip, to maximize the chip surface density capable of being provided on the upper surface of the source substrate.

FIGS. 1A, 1B, 1C, 1D, 1E, 1F and 1G are partial simplified cross-section views illustrating successive steps of an embodiment of a method of manufacturing a device for the transfer of chips from a source substrate onto a destination substrate. More particularly, FIGS. 1A to 1G illustrate steps of a method of manufacturing a device comprising a source substrate 100 and a plurality of elementary chips 150, for example, identical or similar, suspended above the upper surface of substrate 100, each chip 150 being connected to substrate 100 by at least one breakable fastener (two in the example of FIGS. 1A to 1G) connecting the upper surface of source substrate 100 to the lower surface of chip 150. For simplification, a single chip 150, as well as the corresponding portion of substrate 100, are shown in FIGS. 1A to 1G, it being understood that, in practice, a large number of chips 150 may be simultaneously formed on the upper surface of substrate 100.

FIG. 1A illustrates a step of deposition, on the upper surface of source substrate 100, for example, a silicon substrate, of a protection layer 102, for example, made of silicon oxide. Layer 102 is for example in contact with the upper surface of substrate 100. As an example, layer 102 continuously extends over the entire upper surface of substrate 100. As an example, layer 102 has a thickness in the range from 0.1 to 1 μm.

FIG. 1A further illustrates a step of depositing a sacrificial layer 104 on the upper surface of protection layer 102, for example, in contact with the upper surface of protection layer 102. Layer 104 is made of a material selectively etchable over the material of layer 102. As an example, layer 104 is made of polysilicon. Layer 104 for example has a thickness in the range from 100 to 500 nm. Layer 104 comprises through openings 105 emerging onto the upper surface of protection layer 102, defining areas of anchoring of the breakable mechanical fasteners to the upper surface of protection layer 102. In this example, for each elementary chip 150, two separate openings 105 are formed in sacrificial layer 104, respectively corresponding to the anchoring areas of the two breakable mechanical fasteners connecting chip 150 to substrate 100. As an example the sacrificial layer is first continuously deposited over the entire upper surface of protection layer 102, and then locally removed by photolithography and etching to form openings 105. Openings 105 are for example arranged under (vertically in line with) the future chips 150 of the device. As an example, for each chip 150 of the device, openings 105 have the shape of two parallel strips, for example, rectilinear, arranged under two different halves of chip 150. As an example, each opening 105 has a length (not shown in FIG. 1A) substantially equal to the horizontal dimension of chip 150 in the longitudinal direction of the strip. Each opening 105 for example has a width in the range from 0.1 to 10 μm, for example, from 0.2 to 2 μm.

Figure 1B:
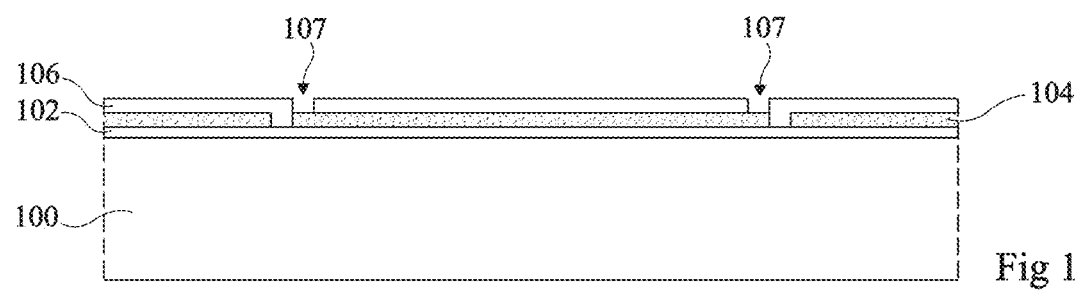

FIG. 1B illustrates a step of depositing, on top of and in contact with the upper surface of sacrificial layer 104, a layer 106 of a material such that the material of layer 104 is selectively etchable over the materials of layers 102 and 106. As an example, layer 106 is made of the same material as layer 102. Layer 106 is deposited with a thickness greater than that of sacrificial layer 104, to totally fill the openings 105 previously formed in sacrificial layer 104. Layer 106 may then be planarized, for example, by chemical-mechanical polishing (CMP), so that a non-zero thickness of layer 106 remains above the upper surface of sacrificial layer 104 at the end of the planarization step. As an example, at the end of the planarization step, the thickness of layer 106 above the upper surface of sacrificial layer 104 is in the range from 50 to 500 nm, for example, from 100 to 200 nm.

In this example, the breakable mechanical fasteners connecting chips 150 to substrate 100 are formed in layer 106. Layer 106 comprises, for each chip 150, one or a plurality of through openings 107 emerging onto the upper surface of sacrificial layer 104 and at least partially delimiting the breakable mechanical fastener(s) intended to connect chip 150 to substrate 100. In the shown example, for each chip 150, layer 106 comprises two separate through openings 107 having, in top view, the shape of rectilinear strips parallel to the openings 105 previously formed in layer 104 (FIG. 1A).

More particularly, in this example, in top view, the two openings 107 are arranged between the two openings 105, for example, respectively juxtaposed to the two openings 105. As an example, each opening 107 has a length greater than or equal to the horizontal dimension of chip 150 in the longitudinal direction of the strip. Each opening 107 for example has a width in the range from 0.05 to 10 µm, for example, from 0.1 to 1 µm. As an example, layer 106 is first continuously deposited over the entire surface of the structure obtained at the end of the steps of FIG. 1A, and then locally removed by photolithography and etching to form openings 107.

Figure 1C:
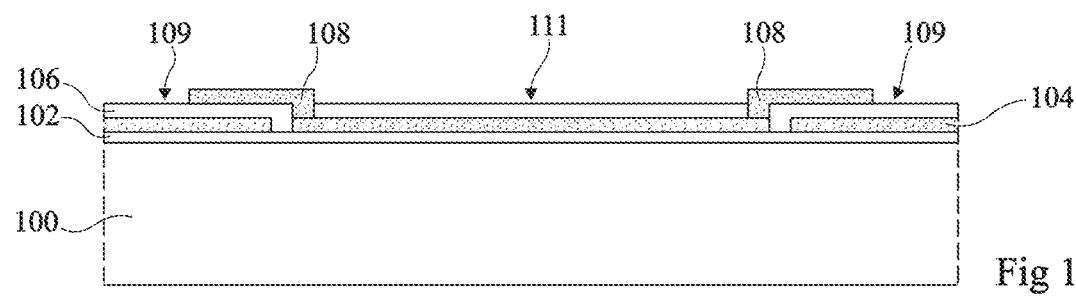

FIG. 1C illustrates a step of depositing a second sacrificial layer 108 on top of and in contact with the upper surface of layer 106. Layer 108 is made of a material such that layer 108 is selectively etchable over layers 102 and 106. As an example, layer 108 is made of the same material as layer 104. The thickness of layer 108 is greater than the thickness of layer 106 above sacrificial layer 104, so that layer 108 totally fills the openings 107 previously formed in layer 106 (FIG. 1B). As an example, the thickness of layer 108 is in the range from 100 to 500 nm.

Layer 108 is for example deposited over the entire upper surface of the structure obtained at the end of the steps of FIGS. 1A and 1B, and then locally removed, for example, by photolithography and etching, to define areas 109 of anchoring of the breakable mechanical fasteners to chip 150. More particularly, in this example, each anchoring area 109 is arranged, in top view, at a distance from an opening 105 (FIG. 1A) previously formed in lower sacrificial layer 104 (that is, not juxtaposed to an opening 105), on the side of opening 105 opposite to opening 107 (FIG. 1B) previously formed in layer 106. In the shown example, layer 108 is further removed opposite a central portion 111 of the chip located, in top view, between the two openings 107 previously formed in layer 106.

Figure 1D:
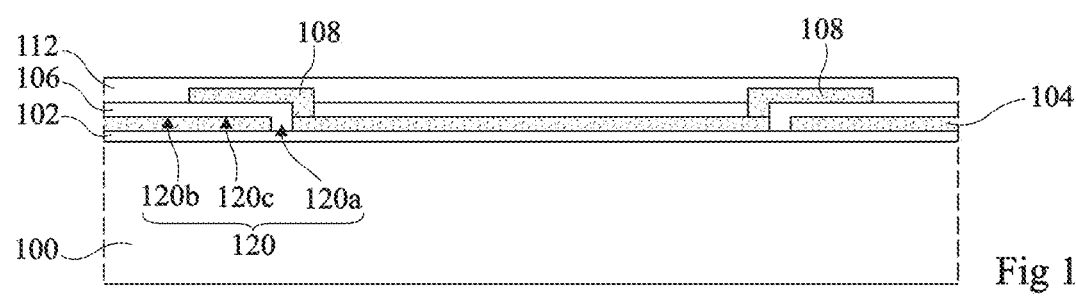

FIG. 1D illustrates a step of depositing an upper protection later 112 on top of and in contact with the upper surface of the structure obtained at the end of the steps of FIGS. 1A, 1B, and 1C. Layer 112 extends over the entire upper surface of the structure, that is, on top of and in contact with the upper surface of layer 108 and on top of and in contact with the upper surface of layer 106 in regions 109 and 111 where layer 108 has been removed. Layer 112 is made of a material such that layers 104 and 108 are selectively etchable over layer 112. As an example, layer 112 is made of the same material as layer 102 or as layer 106. Layer 112 is deposited with a thickness greater than that of sacrificial layer 108, to totally fill the openings 109 and 111 previously formed in layer 108. Layer 112 may then be planarized, for example, by chemical-mechanical polishing (CMP). As an example, at the end of the planarization step, there remains a non-zero thickness of layer 112 above the upper surface of sacrificial layer 108, for example, a thickness in the range from 50 nm to 5 µm, for example, from 100 nm to 1 µm.

At this stage, the breakable mechanical fasteners 120 of the device are defined. More particularly, each breakable mechanical fastener 120 comprises:

at the level of an opening 105 formed in sacrificial layer 104 (FIG. 1A), a first portion 120a of layer 106 having its lower surface in contact with the upper surface of lower protection layer 102, and having its upper surface separated from upper protection layer 112 by sacrificial layer 108;

at the level of opening 109 formed in sacrificial layer 108 (FIG. 1C), a second portion 120b of layer 106 having its upper surface in contact with the lower surface of upper protection layer 112 and having its lower surface separated from lower protection layer 102 by sacrificial layer 102; and between opening 105 and opening 109, a third portion 120c of layer 106 extending horizontally from a lateral edge of first portion 120a to a lateral edge of second portion 120b.

The fracture area of each breakable mechanical fastener 120 for example corresponds to its horizontal portion 120c, or to the junction between its horizontal portion 120c and its vertical portion 120a. The energy to be applied to break fasteners 120 may be accurately controlled by adapting the sizing of the fasteners, and in particular the thickness of layer 106 and the dimensions of horizontal portion 120c of the fastener.

A normalization thermal treatment may optionally be provided after the forming of upper protection layer 112, for example, an anneal at a temperature in the order of 1,000° C. for a duration in the range from 0.5 to 2 hours, for example, in the order of 1 hour, or an anneal at a temperature in the order of 1,200° C. for a duration in the range from 1 to 10 seconds, for example, in the order of 3 seconds.

Figure 1E:
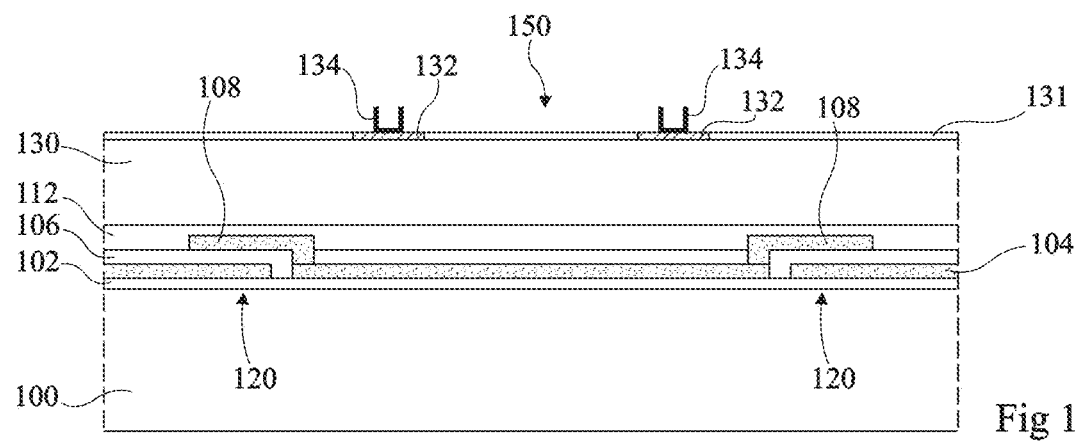

FIG. 1E illustrates a step of forming elementary chips 150 on the upper surface of protection layer 112. FIG. 1E more particularly illustrates a step of transferring a functional layer 130 onto the upper surface of protection layer 112, and of forming of elementary chips 150 inside and/or on top of functional layer 130. The forming of elementary chips 150 is not detailed, the provided solutions being compatible with most usual elementary chip structures.

As an example, layer 130 is a silicon layer, elementary chips 150 being integrated circuit chips formed inside and on top of silicon layer 130, for example, in CMOS technology.

In another embodiment, layer 130 is a layer of a III-V semiconductor material, for example, gallium nitride, elementary chips 150 being light-emitting diodes formed inside and on top of layer 130.

In another embodiment, layer 130 is a silicon layer, elementary chips 150 being photovoltaic cells formed inside and on top of silicon layer 130.

In the above-mentioned examples, each elementary chip 150 may comprise, on its upper surface, that is, on its surface opposite to source substrate 100, one or a plurality of terminals 132 of electric connection of the chip to an external device (two terminals 132 in the shown example), for example, in the form of metal areas flush with the upper surface of chips 150. In the shown example, layer 130 is coated, on its upper surface side, with an insulating layer 131, for example, made of silicon oxide, metal areas 132 being arranged in openings formed in insulating layer 131.

FIG. 1E further illustrates an optional step of forming conductive microstructures 134 on the upper surface of electric connection terminals 132, to ease the implementation of a subsequent step of fastening and of electric connection of the chips to an external device. As an example, microstructures 134 are metal microtubes, for example, made of tungsten, formed by a method of the type described in patent application US2011/094789. As a variation, microstructures 132 are microtips of the type described in patent application US2008/190655.

In the above-mentioned examples, each elementary chip may further comprise, on its lower surface, that is, on its surface facing source substrate 100, one or a plurality of terminals (not shown in the drawings) of electric connection of chip 150 to an external device, for example, in the form of metal areas flush with the lower surface of the chip.

As an alternative embodiment, layer 130 is a wavelength conversion layer, for example, a phosphorus layer, or a layer of an array comprising quantum dots, or a stack of multiple quantum wells, elementary chips 150 then being color conversion elements. In this case, elementary chips 150 may comprise no electric connection terminal. More generally, in the case where elementary chips 150 only comprise passive optical components, the latter may comprise no electric connection terminal.

During the step of transfer of functional layer 130 onto the upper surface of upper protection layer 112, the lower surface of layer 130 may be fastened to the upper surface of layer 112, possibly via one or a plurality of intermediate layers, for example, by molecular bonding, by thermocompression, or by any other adapted fastening method.

Figure 1F:
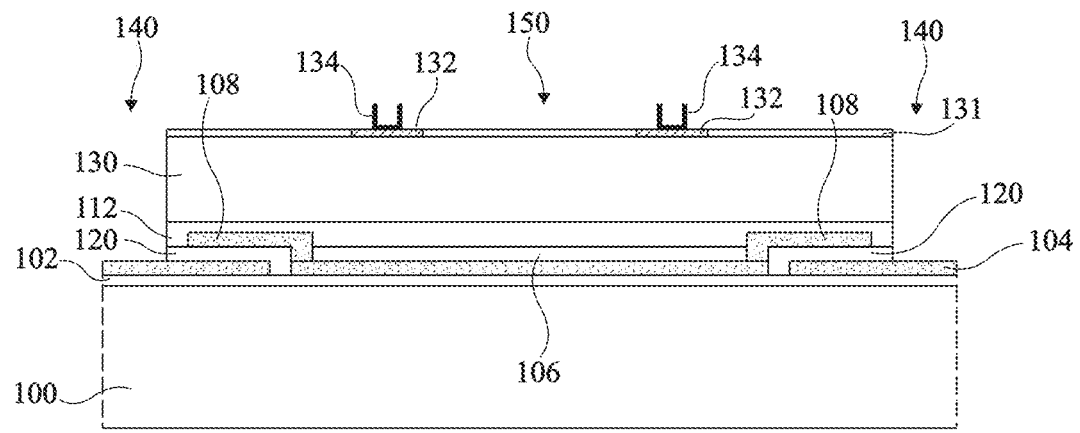

FIG. 1F illustrates a step of etching, from the upper surface of the assembly obtained at the end of the steps of FIGS. 1A to 1E, trenches 140 of singulation of elementary trenches 150. More particularly, in the shown example, trenches 140 extend vertically from the upper surface of the assembly, thoroughly cross functional layer 130 and upper protection layer 112, and emerge onto the upper surface of sacrificial layer 104. Trenches 140 entirely surround each elementary chip 150 of the assembly, to separate the elementary chips from one another. Trenches 140 are for example formed by reactive ionic etching (RIE).

Figure 1G:
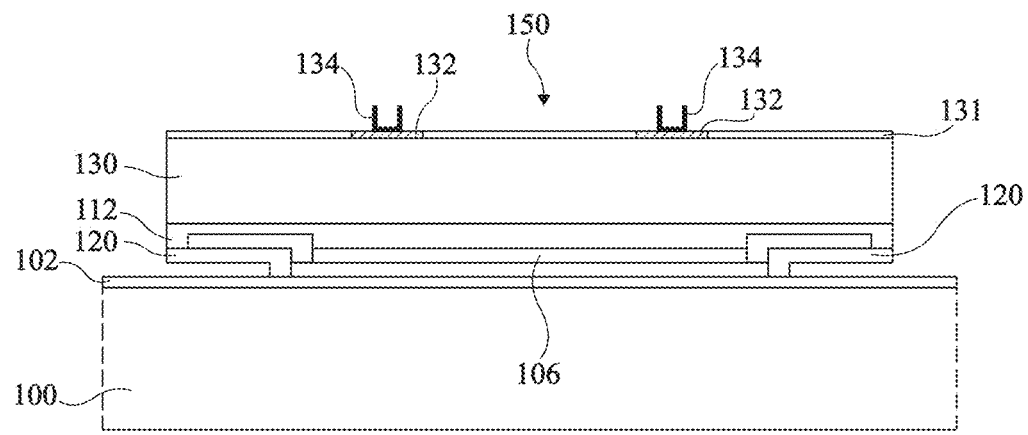

FIG. 1G illustrates a step of removing sacrificial layers 104 and 108, by selective etching of layers 104 and 108 with respect to the other elements of the assembly. The removal of layers 104 and 108 is for example performed by etching based on xenon difluoride (XeF2). Other etch methods may however be used, for example, a wet chemical etching, in which case a drying step may be provided at the end of the etch step, for example, a supercritical drying with $CO_2$. During this step, the etching of layer 108 is carried out via the areas of connection between layer 104 and layer 108 defined by openings 107 of FIG. 1B. The etching of sacrificial layers 104 and 108 results in releasing chips 150 and breakable mechanical fasteners 120. It should be noted that according to the etch method used, a passivation of the sides of the chips may be carried out prior to the etching, to avoid for the chip substrate to be etched during the etching of the sacrificial layers.

At the end of this step, an assembly comprising a plurality of elementary chips 150 suspended above the upper surface of source substrate 100 by breakable mechanical fasteners 120 is obtained. In this example, upper protection layer 112 and the central portion of layer 106 (the portion of layer 106 located, in top view, between the openings 107 formed in layer 106 at the step described in relation with FIG. 1B) are considered as forming part of elementary chip 150. At this stage, only breakable mechanical fasteners 120 connect chip 150 to source substrate 100. Each fastener 120 has a lower surface fastened to the upper surface of source substrate 100 (via lower protection layer 102 integral with substrate 100 in the present example) and an upper surface fastened to the lower surface of chip 150. For each elementary chip 150, the area of fasteners 120 in contact with the lower surface of the chip is smaller than the total area of the lower surface of the chip, for example, smaller than half the total area of the lower surface of the chip, for example smaller than 20% of the total area of the lower surface of the chip, for example, smaller than 5% of the total area of the lower surface of the chip. The rest of the area of the lower surface of the chip is separated from the upper surface of source substrate 100 by a region free of any solid material. In the above-described example, each breakable mechanical fastener 120 is entirely located under (vertically in line with) the chip 150 associated therewith, which enables to maximize the surface density of chips capable of being provided on the upper surface of the source substrate.

Figure 2:
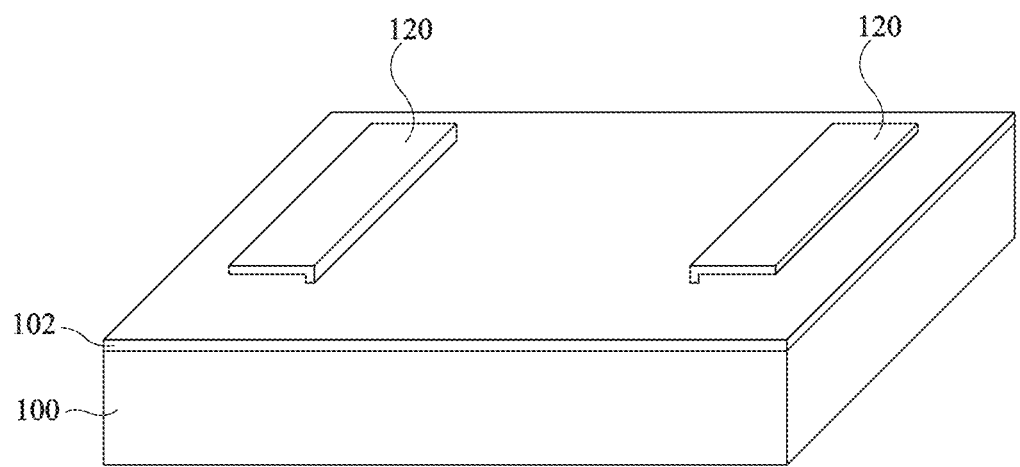
FIG. 2 is a partial perspective view of the device formed by the method of FIGS. 1A to 1G.

FIG. 2 is a perspective view illustrating the breakable mechanical fasteners 120 formed by the above-described method. For clarity, chip 150 has not been shown in FIG. 2. As shown in FIG. 2, each fastener 120 has, in top view, the shape of a rectilinear strip and, in cross-section view, the shape of a lying L, the vertical bar of the lying L having its free end fastened to the upper surface of source substrate 100 and the horizontal bar of the lying L having its free end fastened to the lower surface of chip 150.

It should be noted that the described embodiments are not limited to the above-described example where each chip is connected to the substrate by two breakable mechanical fasteners in the form of a rectilinear strip (in top view). More generally, the number of fasteners may be different from two (at least one fastener). As a variation, each chip may be coupled to the substrate by four breakable mechanical fasteners respectively arranged opposite four corners of the chip. Further, the width of the horizontal portion of the fasteners (width of the strips in the example of FIG. 2) may be variable. As an example, in top view, the breakable mechanical fasteners may have a triangular shape, a V shape (which may be favorable to a concentration of the stress at the time of the tearing off, which enables to more easily break the fastener), or any other adapted shape.

FIGS. 3A, 3B, 3C, 3D, 3E, 3F and 3G are cross-section views illustrating steps of an example of another embodiment of a method of manufacturing a device for the transfer of chips of a source substrate onto a destination substrate. More particularly, FIGS. 3A to 3G illustrate steps of a method of manufacturing a device comprising a source substrate 300 and a plurality of elementary chips 350, for example, identical or similar, suspended above the upper surface of substrate 300, each chip 350 being connected to substrate 300 by at least one breakable mechanical fastener (a single fastener in the example of FIGS. 3A to 3G) connecting the upper surface of source substrate 300 to the lower surface of chip 350. For simplification, only two chips 350, as well as the corresponding portion of substrate 300 are shown in FIGS. 3A to 3G, it being understood that, in practice, a large number of chips 350 may be simultaneously formed on the upper surface of substrate 300.

In this example, each elementary chip 350 comprises a stack of a LED based on a III-V semiconductor material such as gallium nitride, and of a LED control circuit, for example, a CMOS circuit. As an example, elementary chips 350 are chips of the type described in above-mentioned French patent application Nr. 1561421. The described embodiments are however not limited to this specific case. More generally, the method of FIGS. 3A to 3G may be adapted to any other type of semiconductor chips, for example, chips only comprising a LED (with no CMOS control circuit), chips only comprising a CMOS circuit, photovoltaic chips, etc.

Figure 3A:
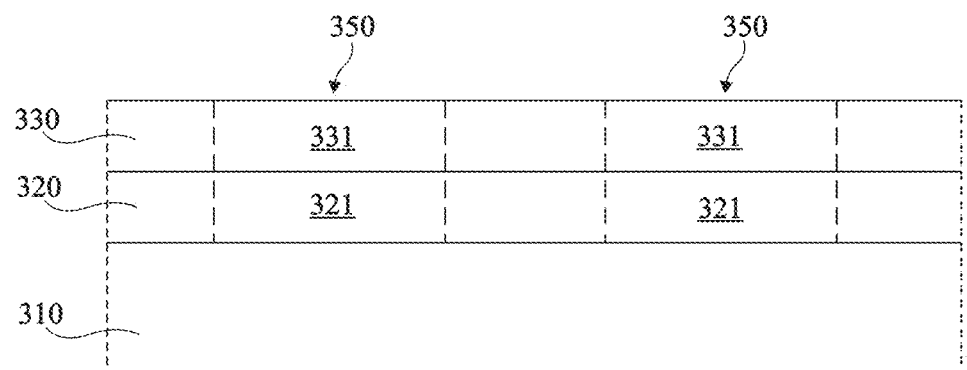
FIGS. 3A, 3B, 3C, 3D, 3E, 3F, and 3G are cross-section views illustrating steps of an example of another embodiment of a method of manufacturing a device for the transfer of chips from a source substrate onto a destination substrate.

FIG. 3A illustrates a step of forming an assembly comprising a stack of a temporary support substrate 310, of a semiconductor substrate 320, for example, made of silicon, having a plurality of elementary control circuits 321 respectively corresponding to the control circuits of the different elementary chips 350 formed inside and on top of it, and of a semiconductor substrate 330, for example, made of a III-V semiconductor material, for example, of gallium nitride, having a plurality of LEDs 331 respectively corresponding to the LEDs of the different elementary chips 350 formed inside and on top of it. In this example, the lower surface of semiconductor substrate 320 rests on the upper surface of support substrate 310 and the lower surface of semiconductor substrate 330 rests on the upper surface of semiconductor substrate 320.

As an example, substrate 320 is first transferred alone onto the upper surface of support substrate 310, and then treated to form elementary control circuits 321, for example, in CMOS technology. Each elementary control circuit 321 for example comprises one or a plurality of transistors capable of controlling the current and/or the voltage applied to LED 331 of the chip. Each elementary control circuit 321 comprises, on the side of its surface opposite to support substrate 330, that is, on the side of its upper surface in the shown example, at least one terminal of electric connection of circuit 321 to LED 331.

Substrate 330 may be formed separately on a growth substrate (not shown), and then treated to form elementary LEDs 331. Substrate 330 is then transferred onto the upper surface of substrate 320 to connect each elementary LED 331 of substrate 330 to the corresponding elementary control circuit 321 of substrate 320. The growth substrate is then removed to obtain the stack shown in FIG. 3A. As a variation, the stack of semiconductor layers forming the LEDs may be transferred onto substrate 320 before individualization of elementary LEDs 331. The growth substrate of the stack of semiconductor layers forming the LEDs is then removed to allow the individualization of the LEDs.

At the end of the steps of FIG. 3A, the elementary chips 350 of the assembly have not been individualized yet. The vertical broken lines of FIGS. 3A to 3E delimit the lateral edges of the future individualized elementary chips.

Figure 3B:
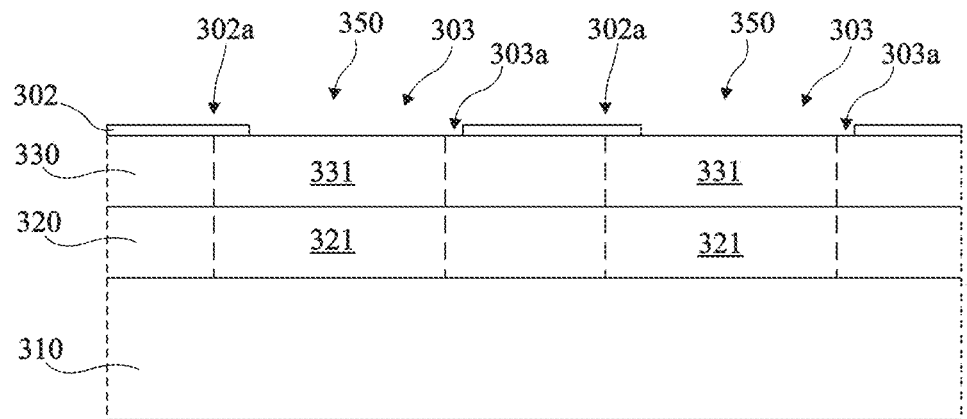
Figure 3C:
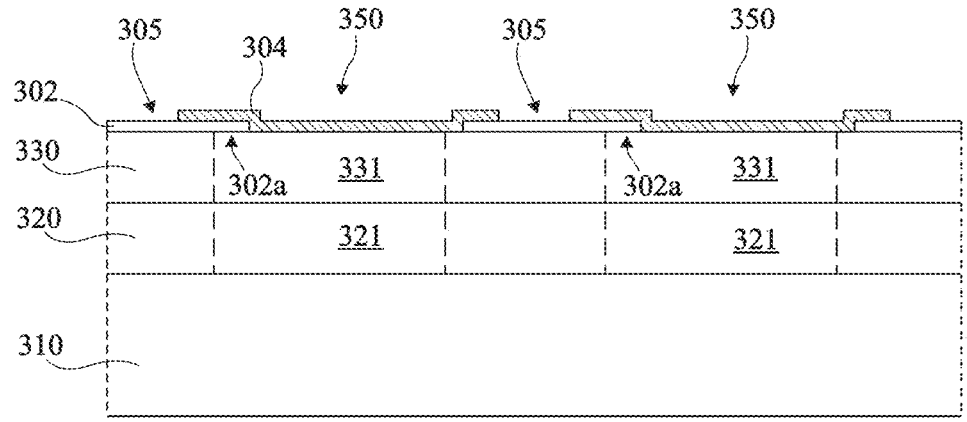
Figure 3D:
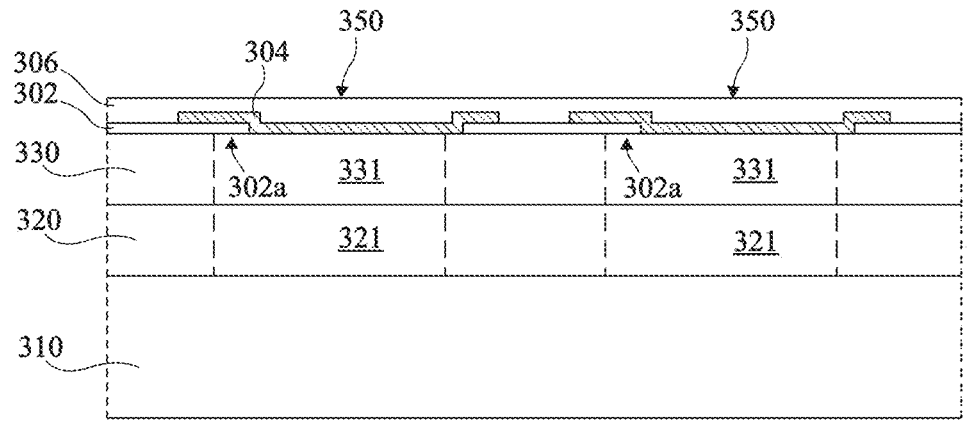

FIGS. 3B to 3D illustrate steps of manufacturing the breakable mechanical fasteners intended to connect elementary chips 350 to source substrate 300.

FIG. 3B more particularly illustrates a step of deposition, on the upper surface of substrate 330, of a lower anchoring layer 302, for example, made of silicon oxide. Layer 302 is for example in contact with the upper surface of substrate 330. Layer 302 comprises through openings 303 emerging onto the upper surface of substrate 330. In this example, for each elementary chip 350, layer 302 comprises an opening 303 extending over the entire surface of the chip, except at the level of a portion of a peripheral region of the chip where layer 302 extends on the upper surface of the chip. More particularly, in this example, for each elementary chip 350, opening 303 extends over the entire surface of the chip except at the level of a lateral edge of the chip, where a portion 302a of layer 302 forms a tab astride the edge of the chip, that is, having a portion of its lower surface in contact with the upper surface of the chip and another portion of its lower surface in contact with the upper surface of substrate 330 in a region of substrate 330 external and adjacent to the chip. At the level of at least another portion of the periphery of each chip, for example, on the side of the lateral edge of the chip opposite to region 302a, opening 303 extends beyond the lateral edge of the chip. In other words, each opening 303 comprises a portion 303a extending, in top view, above a region of substrate 330 external and adjacent to the chip. As an example, layer 302 is first continuously deposited over the entire upper surface of substrate 330, and then locally removed by photolithography and etching to form openings 303.

FIG. 3C illustrates a step of deposition of a sacrificial layer 304 on the upper surface of the assembly obtained at the end of the steps of FIGS. 3A and 3B. Layer 304 is made of a material selectively etchable over the material of layer 302. As an example, layer 304 is made of polysilicon. More generally, any other adapted sacrificial material may be used, for example, aluminum. Layer 304 particularly extends on top of and in contact with the upper surface of chips 350 at the bottom of openings 303, and further extends on top of and in contact with layer 302, outside of openings 303, and in particular on portions 302a of layer 302. Layer 304 comprises, for each chip 350, a through opening 305 emerging onto the upper surface of the tab 302a of layer 302 associated with the chip. In top view, opening 305 is located outside of chip 350 and at a distance from the lateral edge of the chip. As an example, layer 304 is first continuously deposited over the entire upper surface of the assembly obtained at the end of the steps of FIGS. 3A and 3B, and then locally removed by photolithography and etching to form openings 305.

FIG. 3D illustrates a step of deposition, on the upper surface of the assembly obtained at the end of the steps of FIGS. 3A, 3B, and 3C, of an upper anchoring layer 306 made of a material such that sacrificial layer 304 is selectively etchable over layers 302 and 306. As an example, layer 306 is made of the same material as layer 302. In this example, layer 306 extends continuously over the entire surface of the assembly, that is, on top of and in contact with sacrificial layer 304 outside of the openings 305 formed in the sacrificial layer at the previous step, and on top of and in contact with lower anchoring layer 302 in openings 305. Layer 306 is for example deposited with a thickness greater than that of sacrificial layer 305 to totally fill the openings 305 previously formed in sacrificial layer 304, and then planarized, for example, by chemical-mechanical planarization (CMP). As an example, at the end of the planarization step, there remains a non-zero thickness of layer 306 above the upper surface of sacrificial layer 304, for example, a thickness in the range from 50 to 500 nm, for example, between 100 and 200 nm.

Figure 3E:
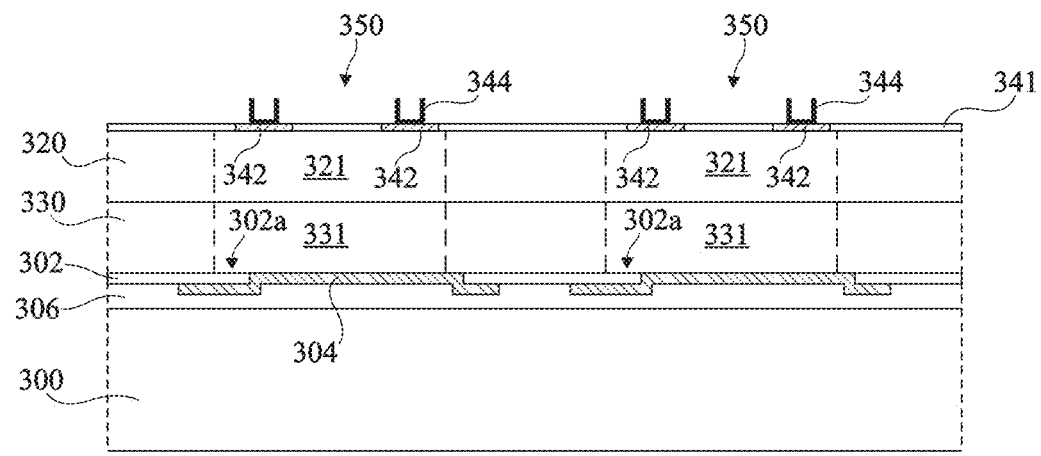

FIG. 3E illustrates a step of transfer of the structure obtained at the end of the steps of FIGS. 3A to 3D onto a support substrate 300, corresponding to the source substrate of the final device, and then of removal of the temporary support substrate 310. During this step, the surface of layer 306 opposite to substrates 330, 320, and 310 (that is, the lower surface of layer 306 in the orientation of FIG. 3E) is bonded, for example, by molecular bonding, to a surface (the upper surface in the orientation of FIG. 3E) of source substrate 300. Temporary substrate 310 is then removed, for example, by grinding and chemical etching, to free the access to the surface of substrate 320 opposite to substrate 330 (that is, the upper surface of substrate 320 in the orientation of FIG. 3E).

FIG. 3E further illustrates a step subsequent to the removal of substrate 310, of forming, on the upper surface of chips 350, terminals 342 of electric connection of chip 150 to an external device (two terminals 342 per chip in the shown example). As an example, terminals 342 are metal areas flush with the upper surface of chips 350. In the shown example, the upper surface of substrate 320 is coated with an insulating layer 341, for example, made of silicon oxide, metal areas 342 being arranged in openings formed in insulating layer 341.

FIG. 3E further illustrates an optional step of forming conductive microstructures 344 on the upper surface of electric connection terminals 342, to ease the subsequent fastening of the microchips to an external device, for example, microtubes or microtips of the type described in relation with FIG. 1E.

Figure 3F:
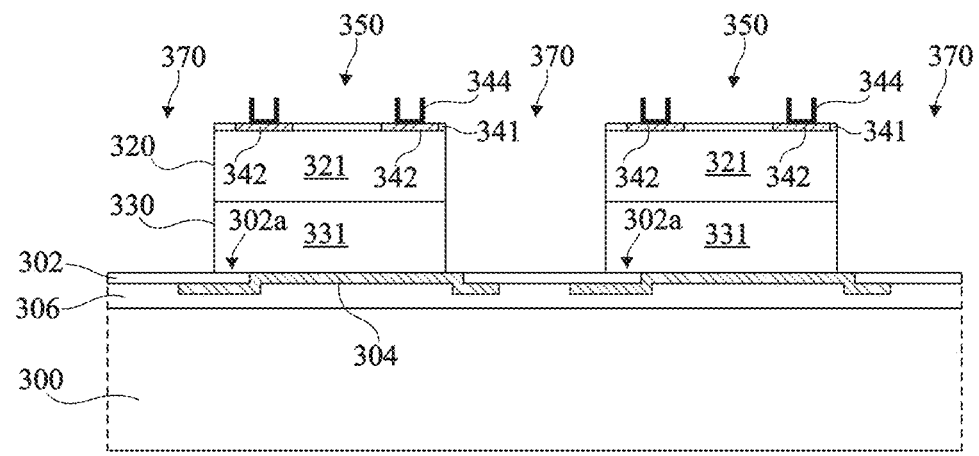

FIG. 3F illustrates a step of etching, from the upper surface of the assembly obtained at the end of the steps of FIGS. 3A to 3E, trenches 370 of singulation of elementary chips 350. More particularly, in the shown example, trenches 370 extend vertically from the upper surface of the assembly, thoroughly cross layer 341 and substrates 320 and 330 and emerge onto the upper surface of layer 302 (at the level of anchoring regions 302a) and of sacrificial layer 304 (at the level of overflow regions 303a of opening 303 of FIG. 3B). Trenches 370 are for example formed by reactive ionic etching (RIE).

Figure 3G:
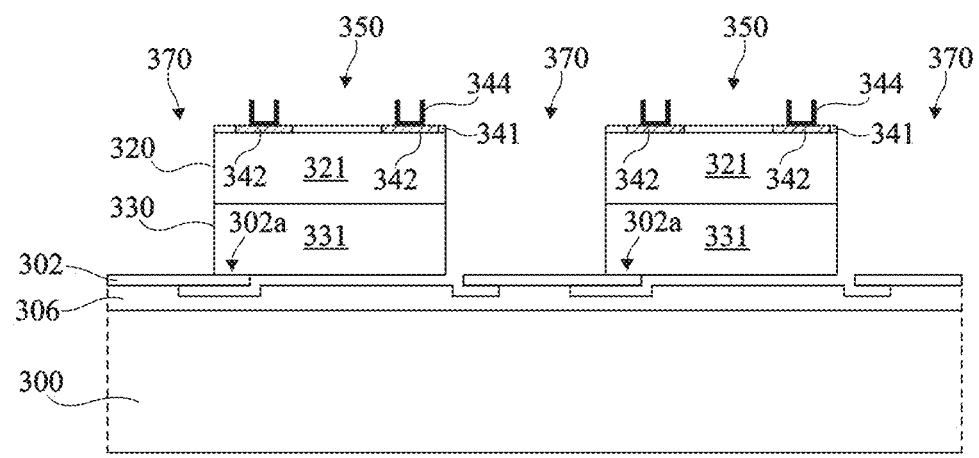

FIG. 3G illustrates a step of removing sacrificial layer 304, by selective etching of layer 304 over the other elements of the assembly. The removal of layer 304 is for example performed by etching based on xenon difluoride (XeF2) in the case of a polysilicon sacrificial layer.

At the end of this step, an assembly comprising a plurality of elementary chips 350 arranged on the upper surface of source substrate 300 is obtained, each chip 350 comprising a stack of a LED 331 arranged on the side of source substrate 300 and of a control circuit 321 arranged on the side of the surface of LED 331 opposite to source substrate 300. In each chip, LED 331 is electrically connected to control circuit 321, and control circuit 321 comprises, on its surface opposite to the LED, terminals of connection of the chip to an external device. Each chip 350 is maintained suspended above source substrate 300 by a breakable mechanical fastener formed by region 302a of layer 302 fastened to the lower surface of the chip. More particularly, each fastener 302a forms a tab comprising:

a first region located under chip 350, having its upper surface fastened to the lower surface of the chip and having its lower surface separated from the upper surface of layer 306 by a region free of any solid material;

a second region opposite to the first region located, in top view, at a distance from the chip and from the first region, having its lower surface fastened to the upper surface of layer 306; and a third intermediate region connecting the first region to the second region, the third region having its lower surface separated from the upper surface of layer 306 by a layer free of any solid material.

The fracture area of each breakable mechanical fastener 302a corresponds to its third region, that is, to the horizontal portion of layer 302 located between the region of fastening of the tab to the upper surface of layer 306 and the region of fastening of the tab to the lower surface of the chip. The energy to be applied to break fasteners 302a may be controlled by adapting the sizing of the fasteners (and of areas 304).

Here again, the described embodiments are not limited to the above-described example where each chip is connected to the substrate by two breakable mechanical fasteners in the form of a rectilinear strip (in top view). More generally, the number of breakable mechanical fasteners may be different from two (at least one fastener) and the shape of the fasteners may be different from what has been previously described.

Figure 4A:
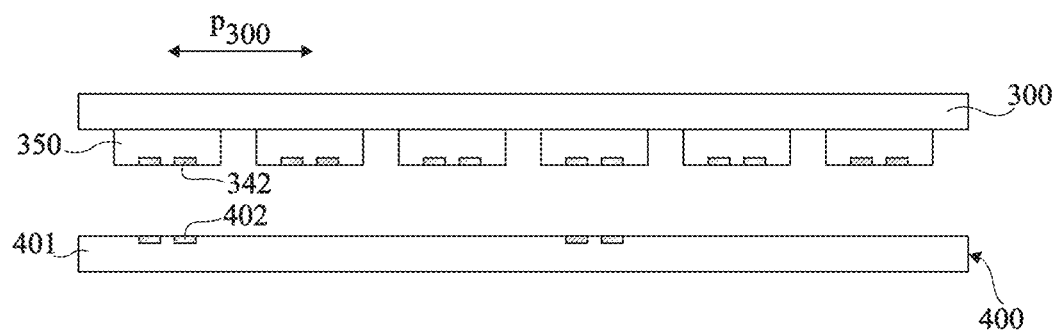
FIGS. 4A, 4B, and 4C are cross-section views illustrating steps of an embodiment of a method of chip transfer from a source substrate onto a destination substrate by means of a device formed by the method of FIG. 1A to 1G or by the method of FIGS. 3A to 3G.
Figure 4B:
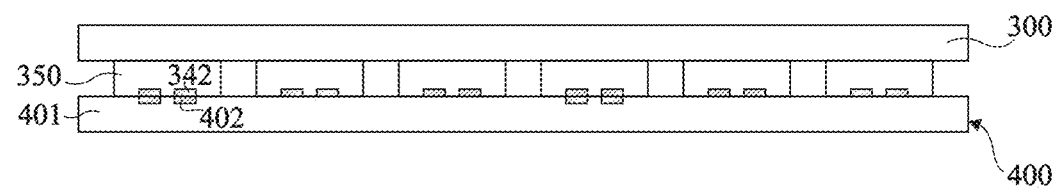
Figure 4C:
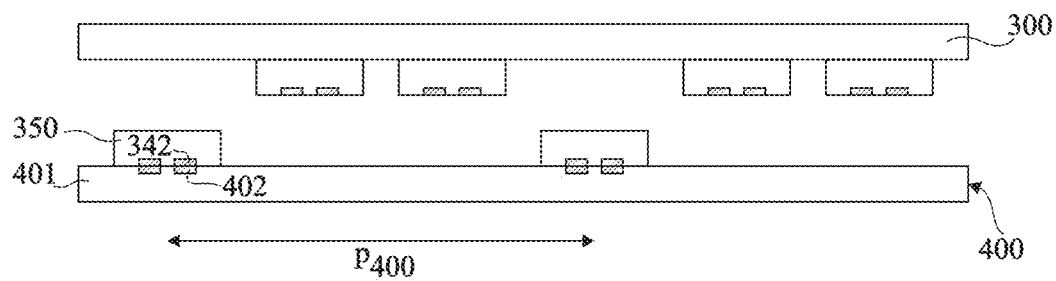

FIGS. 4A, 4B, and 4C are cross-section views illustrating steps of an embodiment of a method of transferring chips from a source substrate onto a destination substrate by means of a device formed by the method of FIGS. 3A to 3G, it being understood that a similar transfer method may be implemented based on a device formed by the method of FIGS. 1A to 1G.

As an example, the method of FIGS. 4A to 4C may be implemented on manufacturing of an emissive LED display device. In this example, the source substrate corresponds to substrate 300 of the device of FIG. 3G, and destination substrate 400 comprises a support plate or sheet 401 made of an insulating material, having electric connection elements, for example, conductive tracks and lands, arranged thereon. Destination substrate 400 is for example, a passive substrate, that is, it only comprises electric connection elements for conveying the control and power signals of elementary chips 350 (corresponding to pixels of the display device). As a variation, the elementary chips of the device are simple LEDs, with no integrated control circuit, in which case destination substrate 400 may be an active substrate, for example, a CMOS circuit, integrating LED control circuits. Destination substrate 400 comprises a connection surface, it upper surface in the shown example, intended to receive chips 350. For each chip of the final device, destination substrate 400 comprises, on its connection surface, a plurality of electric connection areas 402 (one per electric connection terminal of the chip) intended to be respectively connected to the electric connection terminals of the chip.

FIG. 4A illustrates a step during which, after having separately formed chips 350 on source substrate 300, and destination substrate 400, chips 350 are positioned opposite the corresponding transfer areas of destination substrate 400, with the connection surfaces of the chips 350 facing the connection surface of substrate 400, using source substrate 300 as a handle.

To simplify the drawings, chips 350 have not been detailed in FIGS. 4A to 4C. Only the electric connection areas 342 of the chips are shown in the drawings.

Chips 350, fastened to source substrate 300 by their LEDs 331 (FIG. 3G) via breakable mechanical fasteners 302a (FIG. 3G) are brought opposite the corresponding reception areas of destination substrate 400, with their connection surfaces facing the connection surface of substrate 400.

FIG. 4B illustrates a step during which chips 350 are fastened to destination substrate 400 and electrically connected to destination substrate 400, by fastening and connection of electric connection areas 342 of the chips to the corresponding electric connection areas 402 of substrate 400. As an example, the electric connection areas 342 of the chips are coated with microtubes 344 as described in relation with FIG. 3G, and the corresponding electric connection areas 402 of substrate 400 are protruding. The assembly comprising source substrate 300 and chips 350 is then pressed against destination substrate 400, with the connection surfaces of chips 350 facing the connection surface of substrate 400. For each chip having its electric connection areas 342 opposite electric connection areas 402 of substrate 400, the chip microtubes 344 penetrate into the corresponding electric connection areas 402 of substrate 400. The described embodiments are however not limited to this specific connection mode. As a variation, chips 350 may be fastened by direct bonding of the electric connection areas 342 of the chips to the corresponding electric connection areas 402 of substrate 400, by welding or soldering of areas 342 to areas 402, or by any other adapted fastening method.

FIG. 4C illustrates a step during which source substrate 300 is removed, which causes the breaking of the breakable mechanical fasteners connecting to source substrate 300 the chips 350, now fastened to the destination substrate.

In practice, pitch $p_{300}$ of the chips on source substrate 300, for example, in the order of from 10 to 50 μm, may be smaller than pitch $p_{400}$ of the final device after transfer onto substrate 400, for example, in the range from 15 μm to 1 mm, for example, in the order of from 100 to 500 μm.

In the example described in relation with FIGS. 4A to 4C, pitch $p_{400}$ of chips 400 on destination substrate 400 is a multiple of pitch $p_{300}$ of the chips on source substrate 300. As an example, $p_{400}=N*p_{300}$, N being an integer in the range from 1 to 10. Thus, it is provided to only transfer part of chips 350 from substrate 300 to substrate 400, at the pitch of substrate 400 (that is, one chip out of n with n=$p_{400}/p_{300}$), and then, if need be, to shift substrate 300 with the remaining chips to transfer another part of the chips from substrate 300 to substrate 400, and so on until all the chips of the display device have been fastened to destination substrate 400.

At each iteration, chips 350 are selectively separated from source substrate 300. Source substrate 300 and the remaining chips 350 are then removed, as illustrated in FIG. 4C.

The provision of the breakable mechanical fasteners connecting chips 350 to source substrate 300 easily enables to selectively separate chips 350 from source substrate 300. Indeed, on removal of source substrate 300, only the chips fastened to destination substrate 400 are separated from source substrate 300, by breaking of their breakable mechanical fasteners, the other chips remaining fastened to the source substrate due to the lack of connection between these chips and the destination substrate. It should be noted that the provision, on the side of destination substrate 400, of electric connection areas protruding from the upper surface of substrate 400 enables to ease the selective fastening of the chips to destination substrate 400, and thus to selectively separate the chips from source substrate 300 on removal of substrate 300.

As compared with the transfer methods described in above-mentioned international patent application WO2015/193435, an advantage of the method described in relation with FIGS. 4A to 4C is that the transfer is directly performed from the source substrate to the destination substrate, without transiting through an intermediate transfer substrate, which eases the implementation of the transfer.

Specific embodiments have been described. Various alterations and modifications will occur to those skilled in the art. In particular, the described embodiments are limited neither to the examples of methods of manufacturing the breakable mechanical fasteners described in relation with FIGS. 1A to 1G and 3A to 3G, nor to the examples of shapes of the breakable mechanical fasteners described in relation with FIGS. 1A to 1G and 3A to 3G. More generally, the breakable mechanical fasteners may be formed by any method comprising an alternation of at least one step of deposition of a permanent solid layer, for example, made of silicon oxide, and of at least one step of deposition of a sacrificial solid layer, for example, made of polysilicon, or of a material selectively etchable, for example, by wet etching, over the other materials of the structure. The successive permanent and sacrificial solid layers may comprise openings, for example, formed by photolithography and etching, in particular to define the shape of the breakable mechanical fasteners and to enable to totally remove the sacrificial layer(s) once the chips have been fastened to the source substrate and individualized.

It should further be noted that in a transfer device of the type described in relation with FIG. 1G or 3G, due to the small distance separating each elementary chip from the source substrate, it may happen that the rear surface of the chip (the lower surface in the orientation of FIGS. 1G and 3G) is pressed against the upper surface of the source substrate, particularly when a vertical pressure is applied to the front surface of the chip. In this case, to avoid for the chip to remain stuck, by molecular bonding, on the upper surface of the source substrate, it may be provided to provide a certain roughness to the upper surface of the source substrate (the upper surface of layer 102 in the example of FIG. 1G or the upper surface of layer 306 in the example of FIG. 3G), for example, a roughness greater than 5 nm.

Further, the described embodiments are not limited to the examples of materials and of dimensions mentioned in the present disclosure.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for the transfer of chips from a source substrate onto a destination substrate, comprising:
a source substrate having a lower surface and an upper surface; and
a plurality of elementary chips arranged on the upper surface of the source substrate,
wherein each elementary chip is suspended above the source substrate by at least one breakable mechanical fastener, said at least one breakable mechanical fastener being entirely located under the chip and comprising:
a first portion having a lower surface fastened to the upper surface of the source substrate and an upper surface separated from the lower surface of the chip by a region free of any solid material;
a second portion having an upper surface fastened to the lower surface of the chip and a lower surface separated from the upper surface of the source substrate by a region free of any solid material; and
a third portion extending from a lateral edge of the first portion to a lateral edge of the second portion, the third portion having a lower surface separated from the source substrate by a region free of any solid material and an upper surface separated from the chip by a region free of any solid material.

2. The device of claim 1, wherein each elementary chip comprises one or a plurality of terminals of electric connection to an external device arranged on the side of its surface opposite to the source substrate.

3. The device of claim 1, wherein each elementary chip further comprises one or a plurality of terminals of electric connection to an external device arranged on the side of its surface facing the source substrate.

4. The device of claim 1, wherein the upper surface of the source substrate has a surface roughness greater than 5 nm.

5. The device of claim 1, wherein each elementary chip comprises a LED.

6. The device of claim 1, wherein each elementary chip comprises a stack of a LED and of an elementary LED control circuit, the elementary control circuit being arranged on the side of the LED opposite to the source substrate.

7. The device of claim 1, wherein each elementary chip is a wavelength conversion element.

* * * * *